(12) United States Patent
Cowley et al.

(10) Patent No.: US 7,693,501 B2
(45) Date of Patent: Apr. 6, 2010

(54) TECHNIQUES TO DETERMINISTICALLY REDUCE SIGNAL INTERFERENCE

(75) Inventors: Nicholas Cowley, Wroughton (GB); David Sawyer, Swindon (GB); Isaac Ali, Bristol (GB)

(73) Assignee: Intel Corporation, Santa Clara, CA (US)

(*) Notice: Subject to any disclaimer, the term of this patent is extended or adjusted under 35 U.S.C. 154(b) by 596 days.

(21) Appl. No.: 11/614,284

(22) Filed: Dec. 21, 2006

(65) Prior Publication Data

US 2008/0153447 A1 Jun. 26, 2008

(51) Int. Cl.
*H04B 1/10* (2006.01)
*H04B 7/00* (2006.01)

(52) U.S. Cl. ............... 455/296; 455/234.1; 455/250.1; 455/311

(58) Field of Classification Search .............. 455/67.13, 455/296, 234.1, 239.1, 245.1, 250.1
See application file for complete search history.

(56) References Cited

U.S. PATENT DOCUMENTS

| | | | |
|---|---|---|---|
| 5,086,340 A * | 2/1992 | Citta et al. .................... 348/21 |
| 5,420,889 A | 5/1995 | Juntti |
| 5,923,378 A * | 7/1999 | Limberg ..................... 348/555 |
| 5,940,143 A * | 8/1999 | Igarashi et al. .............. 348/678 |
| 6,311,048 B1 * | 10/2001 | Loke ........................ 455/245.1 |
| 6,614,806 B1 * | 9/2003 | Nanni ......................... 370/468 |
| 6,668,164 B2 * | 12/2003 | Hughes .................... 455/234.1 |
| 6,670,901 B2 * | 12/2003 | Brueske et al. .............. 341/139 |
| 6,731,703 B2 * | 5/2004 | Kurihara ..................... 375/345 |
| 6,961,552 B2 * | 11/2005 | Darabi et al. ............. 455/241.1 |
| 6,965,656 B2 * | 11/2005 | Koizumi ..................... 375/345 |
| 7,050,774 B2 | 5/2006 | Tominaga |
| 7,221,917 B2 * | 5/2007 | Kroeger .................... 455/192.2 |
| 7,295,517 B2 * | 11/2007 | Anim-Appiah et al. ..... 370/232 |
| 7,295,813 B2 * | 11/2007 | Haub et al. .............. 455/67.13 |

(Continued)

FOREIGN PATENT DOCUMENTS

JP 06-013921 1/1994

(Continued)

OTHER PUBLICATIONS

International Search Report/Written Opinion for PCT Patent Application No. PCT/US2007/085674, mailed Nov. 27, 2007, 11 Pages.

(Continued)

*Primary Examiner*—Duc M Nguyen
(74) *Attorney, Agent, or Firm*—Glen B Choi

(57) ABSTRACT

Techniques are described that can be used to reduce interference in a desired channel by one or more other channels. A radio includes a level detect logic that is responsive to both the frequency offset and amplitude of undesired signals and sets the gain applied to received signals based on the offset frequency and determined amplitude of undesired signals. For example, detection of a signal amplitude in an interfering signal in a channel adjacent to the desired channel may be made. Detection of a signal amplitude in an interfering signal in a channel other than the adjacent channel and desired channel may also be made. Based on detection of one or more interfering channel, a gain of an input signal may be adjusted. Interference arising from at least spectral re-growth of noise and clipping noise may be reduced.

19 Claims, 7 Drawing Sheets

U.S. PATENT DOCUMENTS

| | | | |
|---|---|---|---|
| 2002/0183028 A1 | 12/2002 | Takahashi et al. | |
| 2004/0043733 A1 | 3/2004 | Marrah et al. | |
| 2005/0147192 A1* | 7/2005 | Yamamoto et al. | 375/345 |
| 2006/0040617 A1* | 2/2006 | Haub et al. | 455/67.13 |
| 2007/0254610 A1* | 11/2007 | Levy | 455/136 |
| 2009/0023404 A1* | 1/2009 | Leinonen et al. | 455/114.2 |

FOREIGN PATENT DOCUMENTS

| | | |
|---|---|---|
| JP | 07-336247 | 12/1995 |
| JP | 08-079108 | 3/1996 |
| JP | 2000-295121 | 10/2000 |
| JP | 2005-130076 | 5/2005 |

OTHER PUBLICATIONS

Cowley, Nick et al., "ATSC A/74 compliance and tuner design implications", Digital TV Designline, Nov. 10, 2005, 14 pages.

Cowley, Nick et al., "ATSC compliance and tuner design implications", Electronic Engineering Times, May 2006, 5 pages.

"MT2131 Single-Chip Terrestrial Tuner", Product Brief, RF Silicon and Subsystems Solutions for Broadband Communications and Automotive Electronics, Microtune, Feb. 2005, 2 pages.

* cited by examiner

TECHNIQUES TO DETERMINISTICALLY REDUCE SIGNAL INTERFERENCE

FIELD

The subject matter disclosed herein relates to techniques to reduce signal interference.

RELATED ART

In wireless communications systems, a data signal is transmitted to a receiver using a carrier signal having a particular frequency. The receiver of the carrier signal may receive undesired signals on frequencies other than the particular frequency. The undesired signals may cause interference such that the receiver is unable to accurately reproduce the transmitted data signal. It is desirable to reduce interference so that a receiver is able to accurately reproduce the transmitted data signal.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Figure 1:
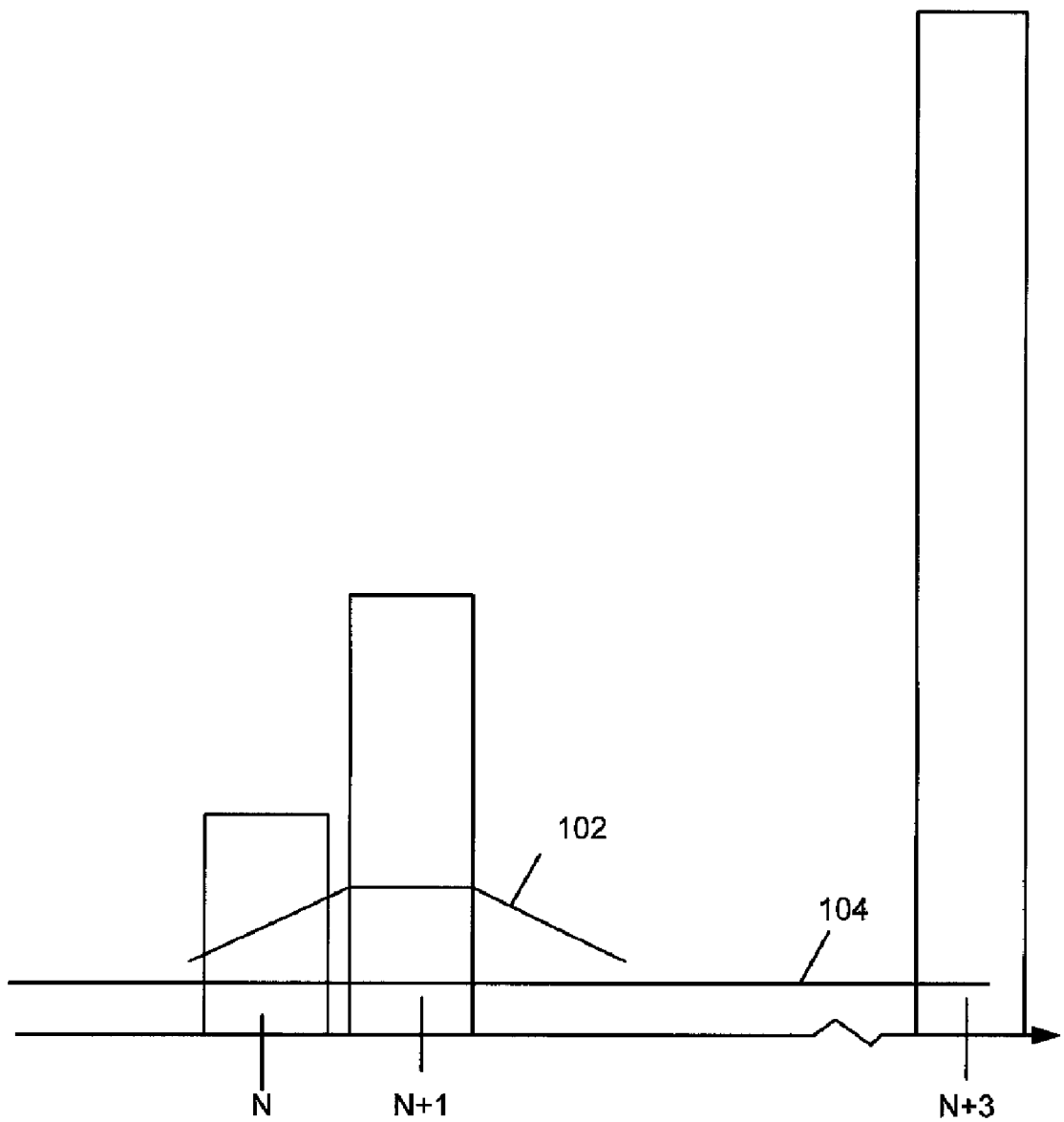
FIG. 1 depicts an example of interference arising from undesired signals.

FIG. 1 depicts an example of interference arising from interfering signals. A signal at frequency N may be a desired digital signal. For example, the desired signal may carry video or other information and may be transmitted wirelessly. Signals from adjacent frequencies of N+1 and N+3 are shown. For example, N+1 may be 6 MHz from frequency N whereas N+3 may be 18 MHz from frequency N, however other the value of 1 may represent frequency offset other than 6 MHz. Noise arising from the signal at N+1 may be third order spectral splatter or "regrowth" noise and appear as depicted at item 102. Noise arising from the signal at N+3 may appear in the form of "clipping noise" (shown as item 104) which may affect a broader frequency range than regrowth noise. For the sake of simplicity, N−1 and N−3 signals are not shown but may be present. Any reference to a signal at N+y offset from a channel of a desired signal may include the N−y signal at N−y offset from the channel of the desired signal, where y is an integer.

For example, N+2 through N+7 order channels may degrade the desired channel through splatter and non linear compression. Therefore, different mechanisms may be involved for immediate and non-immediate adjacent channels. Furthermore, it may be the case that a higher signal level can be tolerated for non immediate adjacent undesired carriers in a stage with classic non linearity generation, than for the immediate adjacent undesired carriers.

Interference of digital television signals can exhibit similar characteristics as those shown in FIG. 1. The Advanced Television Systems Committee developed the ATSC digital television standard for the United States and other countries. Under ATSC, digital television signals are transmitted at frequencies that are adjacent to frequencies used to transmit analog television signals. ATSC standards also allow for digital television services to be transmitted adjacent to other digital television services. Television signals are typically transmitted at frequency intervals of approximately 6 MHz. These undesired television signals, either analog signals or even more degrading digital signals, may interfere with a desired digital television signals. Television signals immediately adjacent to digital television signals can be approximately 100 times in signal amplitude compared to digital television signals whereas at 5 channels offset (i.e., 30 MHz), television signals can be approximately 1000 times signal amplitude. For example, radio frequency signals may be transmitted over a frequency range of approximately 50 to 810 MHz.

Figure 2:
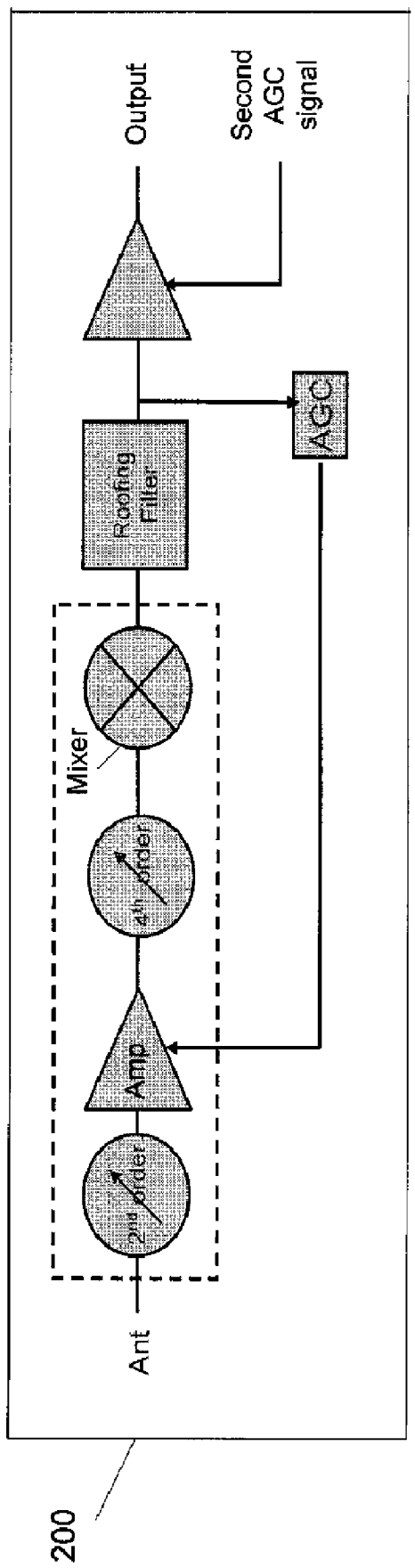
FIG. 2 depicts an example of a prior art front-end portion of a radio receiver capable of receiving signals.

FIG. 2 depicts a prior art radio receiver 200. A composite input signal is received by an antenna (shown as "Ant"). The composite input signal includes the desired signal and undesired interfering signals. The composite signal may include one or more channel in which desired and undesired signals are received. The composite input signal is band pass filtered by a first filter ($2^{nd}$ order filter) which is centered on the desired channel. The filtered signal is then amplified by a variable gain low noise amplifier (shown as "Amp") and then filtered by a second filter stage (4th order filter). The resultant signal is then downconverted to an intermediate frequency (IF) by a mixer. Next, roofing filtering is applied. The three stages of filtering pass the desired signal and immediate adjacent undesired channels, but provide a rapidly decreasing level of gain to undesired channels with increasing frequency offset. The radio receiver of FIG. 2 may use high quality factor components for the first and second filters, and these may be arranged such that passband of both track with the tuning of the desired channel frequency.

The amplitude of this composite output is detected by the automatic gain control (AGC) and used to control the gain of the Amp. The AGC attempts to maximize the carrier-to-noise ratio (C/N) and carrier-to-intermodulation ratio (C/IM) dependent on the level of desired and undesired signals. For example with no undesired signals and a weak desired signal, the gain will be set at a maximum, whereas with a weak desired signal and an adjacent N+1 channel at a higher amplitude, the gain is backed off to reduce the amplitude of the undesired signal to reduce generated intermodulation products. A similar effect is achieved to the N+2 undesired signals. With increasing frequency offset, the amplitude of the undesired signals increases. However, the attenuation by the filter stages provides an increasing attenuation to reduce a level at the AGC detector, hence increasing the gain of the front end.

In this system, only a single detector (shown as AGC) may be used and this system may have no determination of undesired signal frequency offset. Hence for undesired signals further offset than N+1, which are greater in amplitude than N+1 undesired signals, the Amp may provide a larger reduction factor and hence yield an inferior C/N. This system may not deliver the best achievable C/N and C/IM performance and can lead to the receiver having diminished ability to receive any signal.

The prior art system of FIG. 2 typically uses high quality components and filters so that substantial attenuation of undesired signals can be applied prior to when a signal is available to the mixer. Because undesired signals are sufficiently attenuated, the gain is not backed off by detection of the undesired signal potentially preventing the receiver from having an unacceptably high noise figure and so "self-deafening".

In some scenarios, use of the system of FIG. 2 may not provide C/N and C/IM levels required at least by pertinent standards such as but not limited to A/74, "Recommended Practice: Receiver Performance Guidelines (2004) available from Advanced Television Systems Committee (hereafter "A/74"). For example, one such scenario may be where the filters are of lower quality factor and lower order as for example may be used in the case when implementing the radio as an integrated circuit. Using lower quality factor components can restrict the level of attenuation applied to the undesired signals. Similarly, the lower order of the filter can restrict the level of attenuation. It is desirable to improve the performance of a radio receiver, which for example may be implemented as an integrated circuit that does not use or is not able to use high quality factor components. It is desirable to provide comparable C/N and C/IM performance as provided by a system such as that in FIG. 2 where lower quality factor components (e.g., inductors or capacitors) are used. Lower quality factor components may be used because higher quality factor components are not available or are too large to be used in the implementation.

In some embodiments of the present invention, high quality factor components are not available or are too large in size to be used in an implementation. Accordingly, attenuation of undesired signals by filters may not be provided at a sufficiently high level. However, some embodiments of the present invention provide for techniques that can be used to provide sufficient C/N and C/IM performance potentially without using components that are high quality factor or filters of a lower order, i.e., fewer filtering elements.

In accordance with some embodiments of the present invention, a radio uses level detect logic that is responsive to both the frequency offset and amplitude of undesired signals and sets the gain applied to the front end based on the determined frequency offset and amplitude. Some embodiments of the present invention detect channels present at multiple points within an RF signal. Control of gain applied to a received signal may take place based in part on the amplitude and offset of undesired channels. The gain may be optimized in a deterministic manner based on the frequency offset content of the undesired channels to maximize the C/N and C/IM ratios for a tuner.

Figure 3:
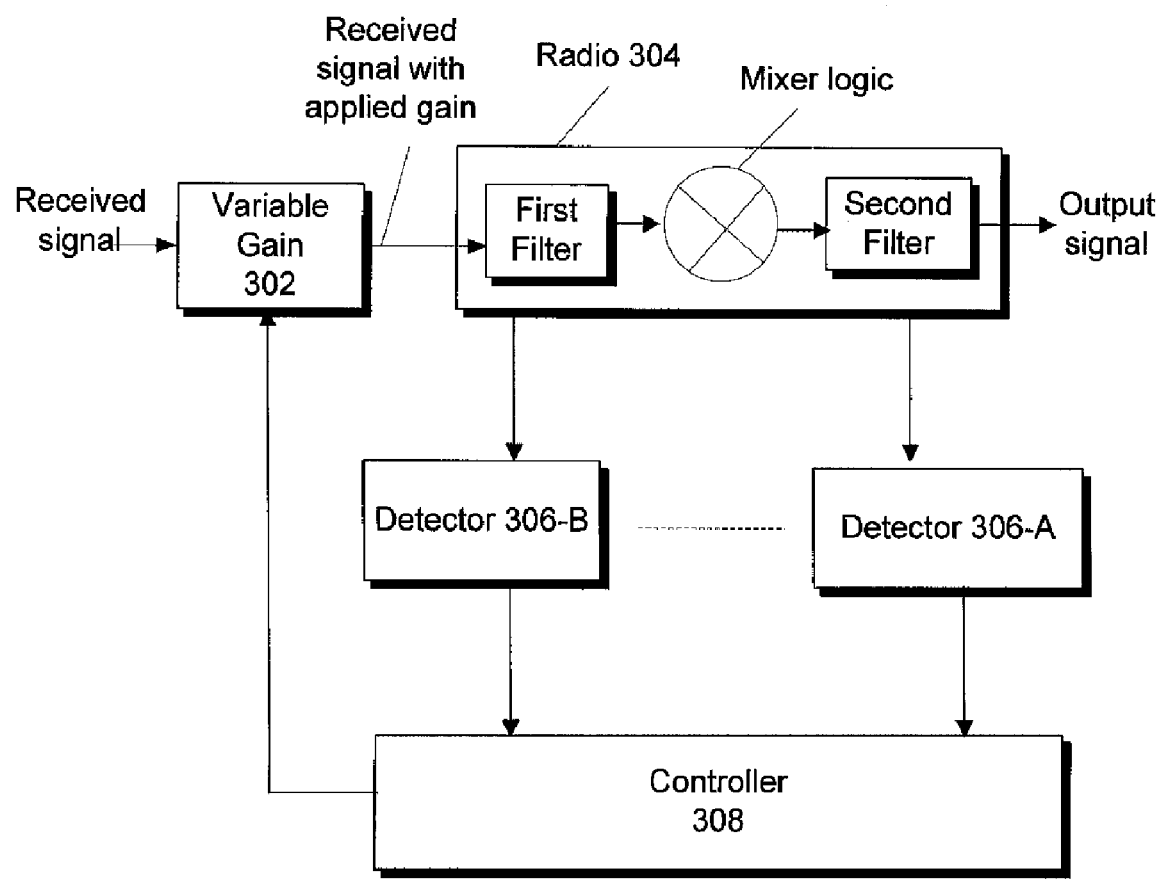
FIG. 3 depicts a system that is capable to reduce interference, in accordance with some embodiments of the present invention.

FIG. 3 depicts an embodiment of the present invention that is capable to reduce interference. In particular, the embodiment of FIG. 3 is able to reduce interference in a receiver with restricted selectivity attenuation of undesired signals. Restricted selectivity attenuation may be due to not using high quality factor components such as one or more high quality factor filter. The embodiment of FIG. 3 is capable to improve the performance of radio receivers by assessing the presence (e.g., amplitude) of interfering signals at differing offsets from the desired signal channel and controlling the radio front-end gain based on the amplitudes and frequency offsets of interfering signals. The applied front-end gain may be determined in a deterministic manner based on both the frequency offset and amplitude of interfering signals. Accordingly, the applied gain may be optimized in a deterministic manner based on the frequency offset and amplitude of the undesired channel or channels to improve the C/N and C/IM ratios for a tuner. Accordingly, the receiver may have an improved ability to accurately reproduce transmitted signals.

An advantage of some embodiments, although not a necessary feature of any embodiment, is that by monitoring the signal level at various points in the signal chain it is possible to determine the content of the signal, and hence the offset frequency of the undesired channels and amplitude with respect to the desired channel. With this information it is possible to reconfigure the variable gain function to offer optimum performance based on determined signal content on a predictive basis.

Variable gain 302 may receive a signal transmitted through a wireless medium. Variable gain 302 may apply a gain (i.e., gain or attenuation) to the received signal in accordance with control signals from controller 308. The received signal may be a composite signal including a desired signal at the desired channel and one or more interfering signals at one or more channel offset from the channel of the desired signal.

Radio 304 may receive a signal with gain applied by variable gain 302. Radio 304 may include a first filter, mixer logic, and second filter. The first filter may be a band pass filter having second order radio frequency band pass and permit at least N+1 offset interfering signals to pass. The first filter may pass channels out to for example N+8 offset from the channel of the desired signal with little attenuation. In practice, the filter passes all input signals but with an attenuation which increases with frequency offset. The first filter may have a pass band of several tens of mega hertz. Mixer logic may be used to convert a radio frequency (RF) signal provided by the first filter to an intermediate frequency signal (IF). The second filter may receive the IF signal provided by the mixer logic. The second filter may be a higher order filter (e.g., fourth order) that is capable of further isolating the frequency range of the desired signals. The second filter may filter out interfering signals except for approximately N+1 and/or N+2 interfering signals but to a lesser extent than a high quality factor filter. The second filter may have a pass band of a few mega hertz. The transition rate from pass band to stop band may be much sharper for the second filter than for the first filter. In some embodiments, the first filter may be a lower order than the second filter. In some embodiments, the first filter may be a higher order than the second filter.

Figure 4:
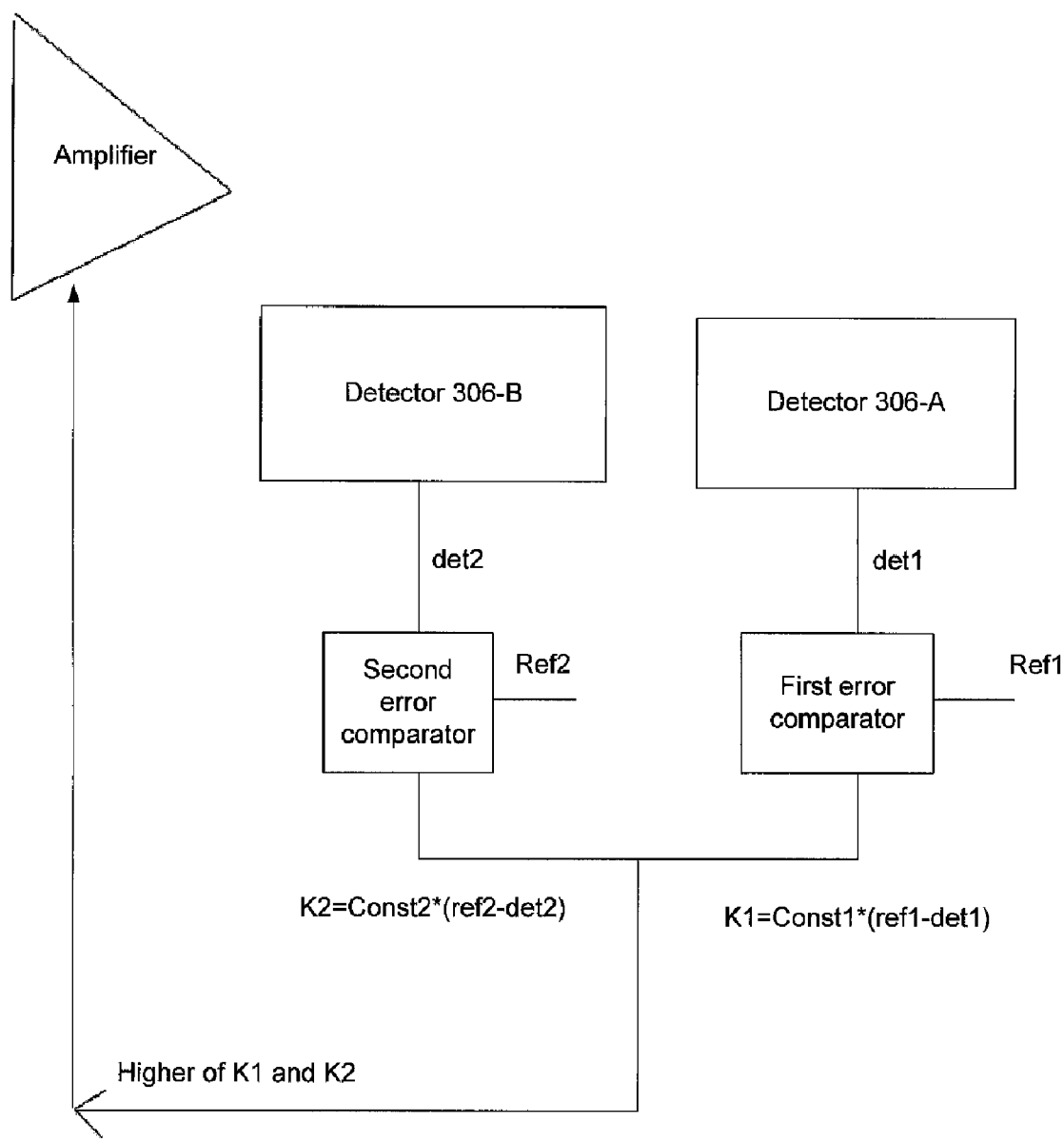
FIG. 4 depicts a system that can be used to provide a control signal, in accordance with some embodiments of the present invention.

Variable gain 302 may apply a gain to the received signal depending in part on the output of any of detectors 306-A and 306-B to set the signal amplitude level of the received signal from variable gain 302 provided to radio 304. For example, the description with regard to FIG. 4 provides a possible manner by which detectors 306-A and 306-B can be used to set the gain applied by variable gain 302.

Detector 306-A and 306-B may determine the amplitude and frequency offset from a desired signal channel of at least one dominant interference signal. Detector 306-A may measure a composite amplitude of the desired channel and an undesired channel at approximately N+1 offset from the desired channel. For example, a composite amplitude may be measured using a broadband amplitude detection circuit.

Detector 306-A may detect whether an interfering signal is present at approximately N+1 offset from the desired signal channel. Interfering signals at approximately N+1 offset from the desired signal channel may cause third order spectral re-growth of noise that affects the desired signal. Detector 306-A may detect the desired channel and adjacent undesired channel(s) with no attenuation, but may not detect non-adjacent undesired channels due to the filtering characteristic of the second filter. There may be a transition region as the attenuation increases where some detection of non-adjacent undesired channels occurs dependent on the order of the second filter.

Detector 306-A may control the gain applied by variable gain 302 to the received signal. Detector 306-A may adjust the gain so that the levels of C/N and C/IM detected by detector 306-A meet system requirements. As the offset of undesired interfering channel or channels from the desired signal channel increases, the detector 306-A will increase the gain of variable gain 302 and so may prevent the receiver from having diminished ability to receive any signal because of high noise figure associated with reduced gain and so prevent self deafening This will cause the amplitude of the signals input to mixer and detected at detector 306-B to increase, however, the C/N and C/IM may no longer be dominated by third order spectral splatter but by compression and higher order splatter and hence the signal may be unacceptably degraded by this compression or higher order splatter.

Detector 306-B may measure a composite amplitude of desired channel and undesired channel or channels beyond approximately N+1 offset from the desired signal channel. For example, a composite amplitude may be measured using a broadband amplitude detection circuit. Detector 306-B may detect whether an interfering signal is present at beyond approximately N+1 offset from the desired signal channel. In practice, detector 306-B detects all channels but the filtering removes further offset channels, hence detector 306-B responds less to further offset channels. Detector 306-B may detect channels up to for example N+4 offset from the desired channel that are incident to the mixer. Interfering signals beyond approximately N+1 offset from the desired signal channel may cause clipping noise to be present on the desired channel. Based on detected interfering signals, detector 306-B may command gain 302 to apply a gain level.

FIG. 4 depicts a system that can be used to provide a gain control signal, in accordance with some embodiments of the present invention. The system may include first and second error comparators coupled to receive signals det1 and det2 from respective detectors 306-A and 306-B. First and second error comparators may receive respective reference signals Ref1 and Ref2. Assuming the detector outputs an increasing level with increasing detected level then the first error comparator outputs a non-zero signal K1 if the signal det1 is greater than a reference signal Ref1 or zero if below Ref1. The output signal K1 is proportional to the amount that det1 is greater than ref1. Signal K1 is a product of a constant, which may have a negative value, Const1, and ref1-det1. If signal det1 is less than or equal to Ref1, then first error comparator outputs no signal or a signal with value of approximately zero.

Assuming the detector outputs an increasing level with increasing detected level then the second error comparator outputs a non-zero signal K2 if the signal det2 is greater than the signal ref2. The output signal K2 is proportional to the amount that det2 is greater than ref2. Signal K2 is a product of a constant, which may be zero, Const2, and ref2-det2. If signal det2 is less than or equal to ref2, then second error comparator outputs no signal or a signal with value of approximately zero.

Figure 5:
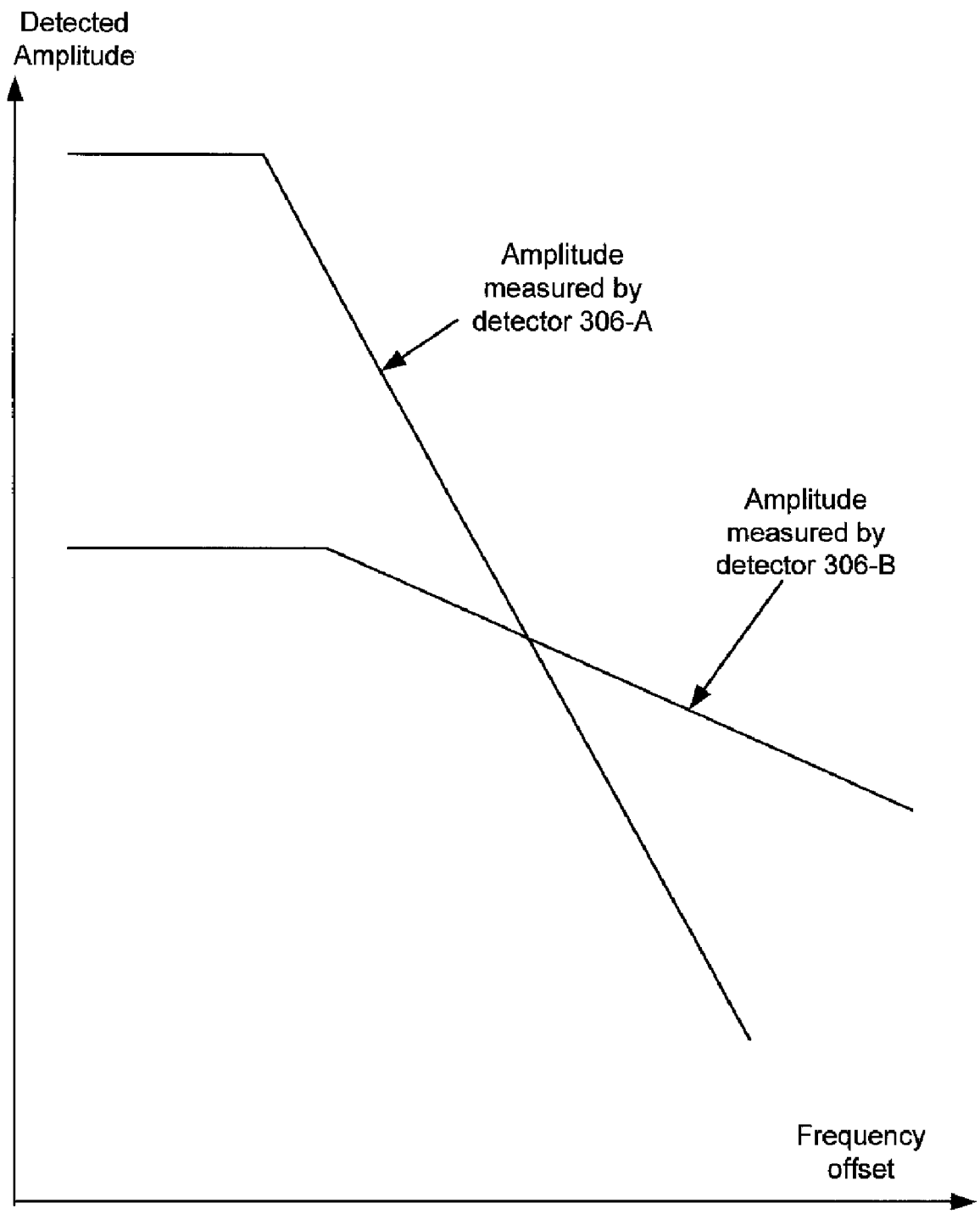
FIG. 5 depicts examples of detected composite amplitudes.

For example, FIG. 5 depicts examples of composite amplitudes detected by each of detector 306-A and 306-B for the same undesired channel. Amplitudes of signals det1 and det2 may be proportional to the composite amplitudes detected by each of detector 306-A and 306-B.

In some embodiments, the greater of the control signals from the first and second error comparators (i.e., K1 or K2) sets the gain of variable gain 302. In other words, when the undesired signal is within the transition region where both detectors are operative or when both N+1 interfering signals and interfering signals further offset than N+1 are detected, variable gain 302 applies a level of gain dependent on the greater of K1 and K2.

Under some transmission standards, such as for example ATSC, the amplitude of the undesired signals increases with frequency offset. If the composite power only from detection by detector 306-B were applied, it would potentially cause the receiver to deafen. If the composite power only from detection by detector 306-A were applied, it could potentially non-linearly clip and again deafen the receiver on larger offsets (because the level into the mixer would be too high). By using the multiple detectors it is possible to optimize for both conditions.

As offset of the undesired channel increases, amplitude increases. However there is a corresponding greater increase in attenuation within second filter leading to an increase in gain of the variable gain 302. As a consequence, the amplitude of the signal into the mixer section increases, potentially leading to an unacceptable intermodulation generation in this stage. This could be mitigated by applying higher power and hence achieving a greater intermodulation intercept as could be applied to prior art solutions but is undesirable because of power limitations. In some embodiments of the present invention, the knowledge is extracted from detector 306-B and detector 306-A and an understanding of the intermodulation generation mechanisms can be used to dynamically adjust the gain applied by gain 302 to reduce the intermodulation.

More detectors can be included whereby each detector detects a range of input frequencies and amplitudes, allowing more levels of interfering signals received by radio 302 to be identified. For example, detectors may be used to detect the presence of interfering signals from any one or more offset, N+x, from the desired signal channel where x is greater than or equal to 0 and can be any frequency offset.

In an embodiment, the variable gain function may be distributed within the radio. In this case the operation of each of the independent gain stages will be similarly applied in a deterministic manner based on the detected signal amplitude and offset. In such an embodiment, the detector may optimally contain but not be restricted to more than two similarly distributed within the architecture. For example, with reference to FIG. 3, a second variable gain amplifier could be included that is capable of adjusting its applied gain based on input from any of detector 306-A or B. The second variable gain amplifier could be positioned between the first filter and mixer logic to amplify the signal provided by first filter.

Figure 6:
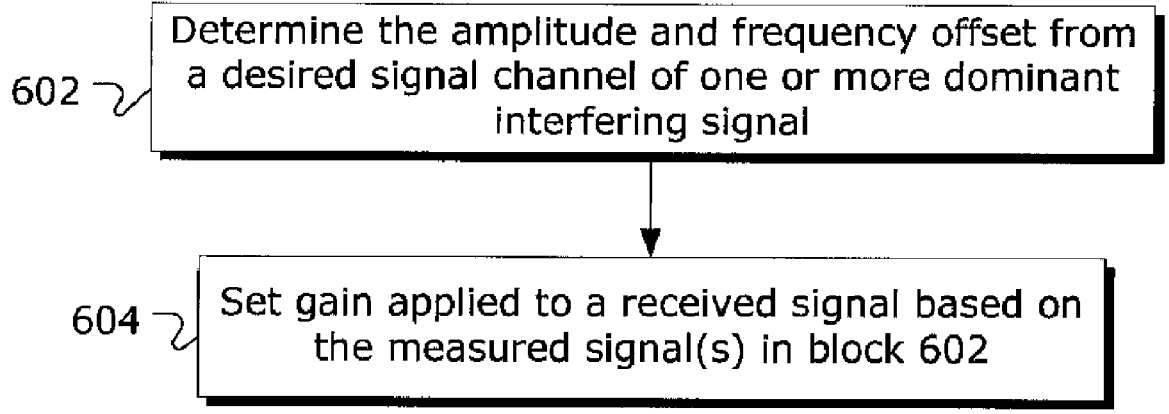
FIG. 6 depicts a process that can be used to reduce interference, in accordance with some embodiments of the present invention.

FIG. 6 depicts a process that can be used to reduce interference in accordance with some embodiments of the present invention.

Block 602 may include determining the amplitude and frequency offset from a desired signal channel of one or more dominant interfering signal. For example, the dominant interfering signal may include undesired signals in one or more channel adjacent to a desired signal channel. For example, an adjacent channel may include an N+1 channel. For example, the dominant interfering signal may in addition or in the alternative include non-adjacent undesired signals (e.g., beyond N+1 channel offset from the desired signal channel).

Block 604 may include setting a gain applied to a received signal based on the measured signal(s) in block 602. A first difference value based on a difference between the detected amplitude of the adjacent interference signal and a first reference value can be determined. A second difference value based on a difference between the detected amplitude of the non-adjacent interference signal and a second reference value can be determined. The gain can be set based on the greater of the first and second difference values. For example, with reference to FIG. 4, the greater of K1 and K2 could be output to set a gain. The gain may be set so that C/N and C/IM ratios are within desired limits as prescribed by relevant system requirements.

Figure 7:
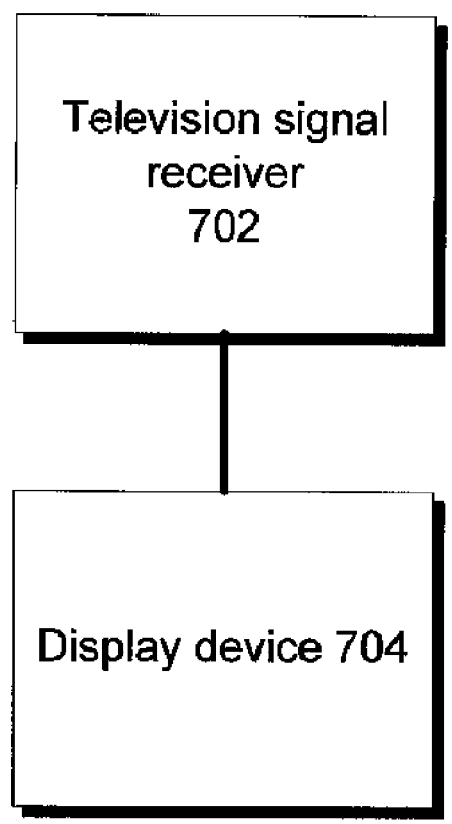
FIG. 7 depicts a system in accordance with some embodiments of the present invention.

FIG. 7 depicts a system that can be used in some embodiments of the present invention. For example, television signal receiver 702 may use embodiments of the present invention. Television signal receiver 702 is capable to receive radio frequency television signals transmitted through a wireless medium using an antenna and radio logic in accordance with relevant standards such as but not limited to A/74. Television signal receiver 702 is capable to decode received signals and provide the decoded signals for display in accordance with relevant standards such as but not limited to A/74 and ATSC. Signals may be provided to display device using any format of interface. Display device 704 may display images or video based on the decoded signals. Display device 704 may be implemented as a television or display monitor such as a computer monitor. In some embodiments, television signal receiver 702 may provide received signals to a computer that includes a processor and memory device. The processor may be capable to decode received signals in accordance with relevant standards.

Embodiments of the present invention are not limited for use in ATSC compliant systems and can be used in any system that experiences interference, whether part of a wireless or wireline receiver.

Embodiments of the present invention may be implemented as any or a combination of: one or more microchips or integrated circuits interconnected using a parentboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

Embodiments of the present invention may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Moreover, embodiments of the present invention may also be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection). Accordingly, as used herein, a machine-readable medium may, but is not required to, comprise such a carrier wave.

The drawings and the forgoing description gave examples of the present invention. Although depicted as a number of disparate functional items, those skilled in the art will appreciate that one or more of such elements may well be combined into single functional elements. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method comprising:
receiving an input signal comprising a desired signal;
detecting for the presence of at least one dominant interfering signal in the input signal, wherein detecting comprises determining an amplitude and frequency offset of the at least one dominant interfering signal; and
setting a gain applied to the input signal based in part on the determined amplitude and frequency offset of the at least one dominant interfering signal, wherein setting a gain comprises:
determining a first difference value based on a difference between a detected amplitude of an adjacent interference signal and a first reference value;
determining a second difference value based on a difference between a detected amplitude of a second interference signal and a second reference value; and
setting the gain based on the greater of the first and second difference values.

2. The method of claim 1, wherein the detecting comprises:
detecting an amplitude of the adjacent interference signal, wherein the adjacent interference signal is approximately adjacent in frequency to the desired signal.

3. The method of claim 2, wherein the detecting further comprises:
detecting an amplitude of the second interference signal, wherein a center frequency of the second interference signal is further away from a center frequency of the desired signal than a center frequency of the adjacent interference signal.

4. The method of claim 3, further comprising detecting an amplitude of a third interference signal, wherein a center frequency of the third interference signal is different from the center frequency of the desired signal and the center frequency of the adjacent interference signal, wherein adjusting a gain applied to the input signal is based in part on the amplitudes and frequency offset of the adjacent interference signal, the second interference signal, and the third interference signal.

5. The method of claim 1, wherein the input signal comprises a radio frequency signal.

6. The method of claim 1, wherein the input signal includes information capable of use to display an image.

7. An apparatus comprising:
a variable gain amplifier to receive an input signal and to apply a gain to the input signal, wherein the input signal includes a desired signal;
radio logic comprising a first filter, mixer logic, and second filter, wherein
the first filter is to attenuate portions of the input signal having applied gain and to provide a resulting signal as a second signal,
the mixer is to frequency shift the second signal, and
the second filter is to attenuate portions of the frequency shifted second signal and to provide a resulting signal as an output signal;
logic to detect for the presence of at least one dominant interfering signal in the input signal and determine amplitude and frequency offset of the at least one dominant interfering signal; and
a controller to set a gain applied by the variable gain amplifier based in part on a determined amplitude and frequency offset of the at least one dominant interfering signal.

8. The apparatus of claim 7, wherein the logic to detect comprises:
logic to detect an amplitude of a first interfering signal that is adjacent in frequency to the desired signal.

9. The apparatus of claim 8, wherein the logic to detect further comprises:
logic to detect an amplitude of a second interfering signal that is not adjacent in frequency to the desired signal.

10. The apparatus of claim 9, wherein the controller is to:
determine a first difference value based on a difference between the detected amplitude of the first interfering signal and a first reference value;
determine a second difference value based on a difference between the detected amplitude of the second interfering signal and a second reference value; and
set the gain based on the greater of the first and second difference values.

11. The apparatus of claim 7, wherein the first filter comprises a second order filter.

12. The apparatus of claim 7, wherein the second filter comprises a fourth order filter.

13. The apparatus of claim 7, wherein an order of the first filter is higher than an order of a second filter.

14. The apparatus of claim 7, wherein an order of the first filter is lower than an order of a second filter.

15. The apparatus of claim 7, wherein the logic to detect comprises at least two detectors, each detector capable to detect for a presence of at least one dominant interfering signal in the input signal and further comprising a second variable gain amplifier, each of the variable gain amplifier and second variable gain amplifier having a gain capable of adjustment by the controller and based in part on detection of one or more dominant interfering signal by any of the at least two detectors.

16. A system comprising:
an antenna to receive an input signal comprising a desired signal;
a receiver comprising:
a variable gain amplifier to receive a second input signal derived from the input signal and to apply a gain to the second input signal,
logic to detect for the presence of at least one dominant interfering signal in the second input signal and determine an amplitude and frequency offset of the at least one dominant interfering signal with relation to the desired signal, and
a controller to set a gain applied by the variable gain amplifier based in part on the determined amplitude and frequency offset of the at least one dominant interfering signal, wherein to set the gain, the controller is to:
determine a first difference value based on a difference between a detected amplitude of a first interfering signal and a first reference value;
determine a second difference value based on a difference between a detected amplitude of a second interfering signal and a second reference value; and
set the gain based on the greater of the first and second difference values.

17. The system of claim 16, further comprising a display device communicatively coupled to the receiver, wherein the display device is to display at least an image provided by content of the second input signal.

18. The system of claim 16, wherein the logic to detect comprises:
logic to detect an amplitude of the first interfering signal that is adjacent in frequency to the desired signal; and
logic to detect an amplitude of the second interfering signal that is not adjacent in frequency to the desired signal.

19. The system of claim 16, wherein the input signal comprises a radio frequency signal.

* * * * *